US009885757B2

(12) United States Patent
Liu et al.

(10) Patent No.: US 9,885,757 B2
(45) Date of Patent: Feb. 6, 2018

(54) METHOD AND APPARATUS FOR DETERMINING THE STATE-OF-CHARGE OF A BATTERY

(75) Inventors: Albert Shih-Young Liu, Palo Alto, CA (US); Steven Diamond, San Francisco, CA (US); Sam Weng, Cupertino, CA (US)

(73) Assignee: Atieva, Inc., Kowloon (HK)

( * ) Notice: Subject to any disclaimer, the term of this patent is extended or adjusted under 35 U.S.C. 154(b) by 1011 days.

(21) Appl. No.: 13/433,017

(22) Filed: Mar. 28, 2012

(65) Prior Publication Data

US 2012/0274331 A1 Nov. 1, 2012

Related U.S. Application Data

(60) Provisional application No. 61/470,653, filed on Apr. 1, 2011.

(51) Int. Cl.
- *G01N 27/416* (2006.01)
- *H02J 7/00* (2006.01)
- *G01R 31/36* (2006.01)

(52) U.S. Cl.
CPC ........ *G01R 31/362* (2013.01); *G01R 31/3631* (2013.01); *G01R 31/3658* (2013.01)

(58) Field of Classification Search
CPC .................................................... G01R 31/36
USPC ......................................................... 324/426
See application file for complete search history.

(56) References Cited

U.S. PATENT DOCUMENTS

| | | | | |
|---|---|---|---|---|
| 5,099,211 A * | 3/1992 | Nowak | ............... | G01R 31/3658 324/434 |
| 6,060,864 A * | 5/2000 | Ito | .................... | G01R 19/16542 320/134 |
| 6,608,482 B2 * | 8/2003 | Sakai | ..................... | B60K 6/445 320/132 |
| 7,570,024 B2 * | 8/2009 | Melichar | ............... | G01R 31/361 320/132 |
| 8,130,000 B2 * | 3/2012 | Botker | ............... | G01R 31/3658 324/429 |
| 8,307,223 B2 * | 11/2012 | Tae | ..................... | G01R 31/3658 713/300 |
| 2003/0101305 A1* | 5/2003 | Kang | .................. | G06F 13/4081 710/303 |
| 2010/0244781 A1* | 9/2010 | Kramer | ................. | H02J 7/0016 320/162 |
| 2011/0215764 A1* | 9/2011 | Takahashi | ................. | H02J 7/00 320/134 |
| 2011/0231122 A1* | 9/2011 | Fabregas | ............ | G01R 31/3665 702/63 |

(Continued)

FOREIGN PATENT DOCUMENTS

| | | |
|---|---|---|
| CN | 101142542 | 3/2008 |
| CN | 101176234 | 5/2008 |

(Continued)

*Primary Examiner* — Edward Tso
*Assistant Examiner* — Ahmed Omar
(74) *Attorney, Agent, or Firm* — Womble Bond Dickinson

(57) ABSTRACT

A method and apparatus for determining the state-of-charge of a battery. In response to detecting that the battery is in a rest state, a pre-conditioning current is drawn from the battery to affect a correlation between the state-of-charge of the battery and an open-circuit voltage of the battery. Thereafter, the open-circuit voltage of the battery is measured, and used to determine the state-of-charge.

23 Claims, 7 Drawing Sheets

(56) References Cited

U.S. PATENT DOCUMENTS

2012/0323512 A1* 12/2012 Rhodin .............. G01R 31/3624
702/63

FOREIGN PATENT DOCUMENTS

| CN | 101320079 | 12/2008 |
|----|-----------|---------|
| JP | 2011053088 | 3/2011 |

* cited by examiner

METHOD AND APPARATUS FOR DETERMINING THE STATE-OF-CHARGE OF A BATTERY

CROSS-REFERENCE TO RELATED APPLICATIONS

This application hereby claims priority to and incorporates by reference U.S. Provisional Application No. 61/470,653, filed Apr. 1, 2011 and entitled "Method and Apparatus for Determining the State-of-Charge of a Battery."

FIELD OF THE INVENTION

The present invention relates to battery systems.

BACKGROUND

Accurate estimation of the state-of-charge (SOC) of batteries is critical for both electric vehicle (EV) and hybrid electric vehicle (HEV) applications. For EV applications, the SOC determines the travel range for the passenger. For HEV applications, the power limits of the battery are often a function of SOC, thus accurate SOC estimation is essential to safe and efficient battery pack operation. Existing techniques for determining SOC often use the battery open-circuit voltage (OCV) to estimate SOC, using a table of pre-determined values that relate OCV to SOC. Other factors, such as battery temperature and battery age may also be included in the determination of SOC.

BRIEF DESCRIPTION OF THE DRAWINGS

The present invention is illustrated by way of example, and not limitation, in the figures of the accompanying drawings and in which like reference numerals refer to similar elements and in which.

DETAILED DESCRIPTION

In various embodiments disclosed herein, a method and apparatus for determining the state-of-charge (SOC) of a battery is described that utilizes circuitry to precondition the battery by partially discharging the battery as part of the SOC determination, providing benefits including, but not limited to a) improved accuracy of the determined SOC, b) reduced processing and power requirements for performing the determination, c) reduced time, data collection and processing required to create the computational model of battery that allows SOC to be determined from the battery open-circuit voltage (OCV), and d) expanded ranges of SOC values where an acceptable level of accuracy for the value of SOC can be characterized. Although generally described in the context of a passenger-conveying vehicle, and more particularly an electric vehicle (EV) or hybrid electric vehicle (HEV) in which the battery subject to SOC determination is the primary or occasional source of vehicle propulsion power, the embodiments described herein may be applied in virtually any battery-powered system or device.

Existing techniques for determining SOC often use the open-circuit voltage (OCV) to estimate SOC, using a table of predetermined values that correlate OCV to SOC. Typically the OCV is measured after the battery has been decoupled from any external load (with no significant charge being drawn from the battery) for a period of time. This voltage is also sometimes referred to as the relaxed voltage. A problem determining SOC in this manner is that certain battery chemistries may exhibit a large hysteresis where the previous state of the battery (either charging or discharging) has a large effect on the OCV at a given SOC (hereinafter referred to as the hysteresis effect or charge/discharge-dependent OCV hysteresis).

Figure 1:
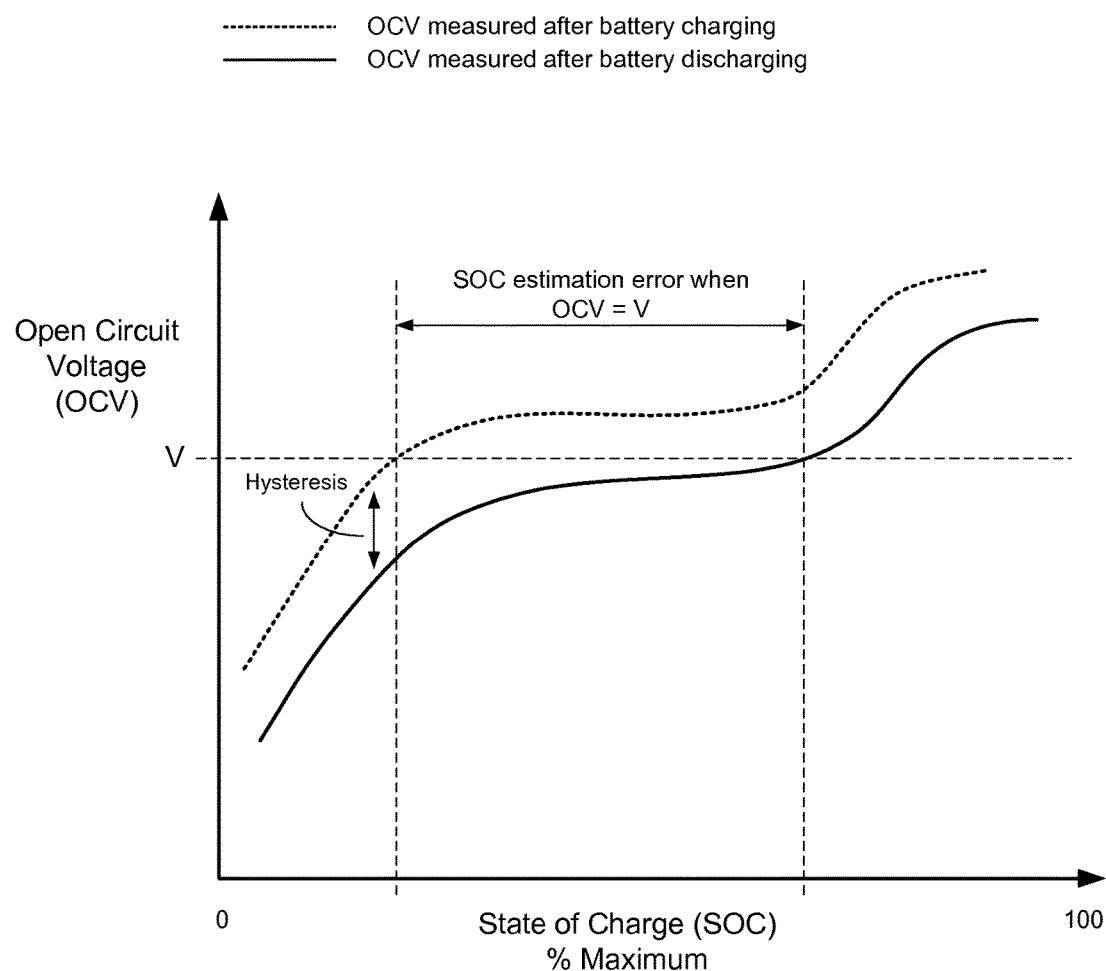
FIG. 1 shows an exemplary chart showing the hysteresis effect between the OCV/SOC relationship after a battery has been charging and the OCV/SOC relationship after a battery has been discharging.

An example of this hysteresis effect is shown in FIG. 1. In this example, the SOC corresponding to the OCV measured after the battery has been previously charging, a charging-state correlation (as shown by the upper dashed line curve), is lower than the SOC corresponding to the OCV measured after the battery has been previously discharging, a discharging-state correlation (as shown by the lower solid line curve). Thus if SOC was determined without compensating for this hysteresis, the value determined could be incorrect by a significant amount, especially if the value of OCV corresponds to the central portion of the OCV/SOC curve with a flatter slope, as shown by the dashed line corresponding to an OCV voltage equal to V. Also, the flatness of the central portion of the OCV/SOC curve causes the SOC estimation error to be greater for values of OCV that correspond to that central portion compared to OCV values that correspond the other portions of the curve where the slope is steeper. Therefore, to ensure sufficient accuracy, it may be determined that the estimation error of SOC is too large for the estimated value of SOC to be useful when determined from the portion of the curve with the flatter slope. Thus estimation of SOC may not be attempted if the value of OCV corresponds to that flatter portion of the OCV/SOC curve.

In one embodiment, a mathematical or empirical model is maintained and/or evaluated by a battery management system to compensate for the hysteresis effect described above. For example, the battery management system may track or otherwise determine the recent charge/discharge history of the battery and input data representative of that history into the mathematical/empirical model to determine the SOC, in effect, choosing from among two or more SOC-to-OCV correlation tables (or applying the history data as coefficients or variables within closed mathematical expressions) according to the charge/discharge history. Tracking the charging/discharging state of the battery is not as simple as detecting garage-time battery-recharging, however, as the battery system may alternate between battery charging and discharging operations during vehicle drive-time (e.g., discharging when providing motive power, charging during regenerative braking in an HEV or EV, and charging from an combustion-engine-powered alternator or generator during drive-time in an HEV). Accordingly, significant amounts of time, data collection and processing may be required to track and model the battery charging/discharging state, and the resulting correlation may be restricted to a limited set of battery chemistries. Moreover, the complexity of the model may require significant computation (with the corresponding power and/or time required for processing) when executed in the operational system containing the battery (such as the EV or HEV).

Figure 2:
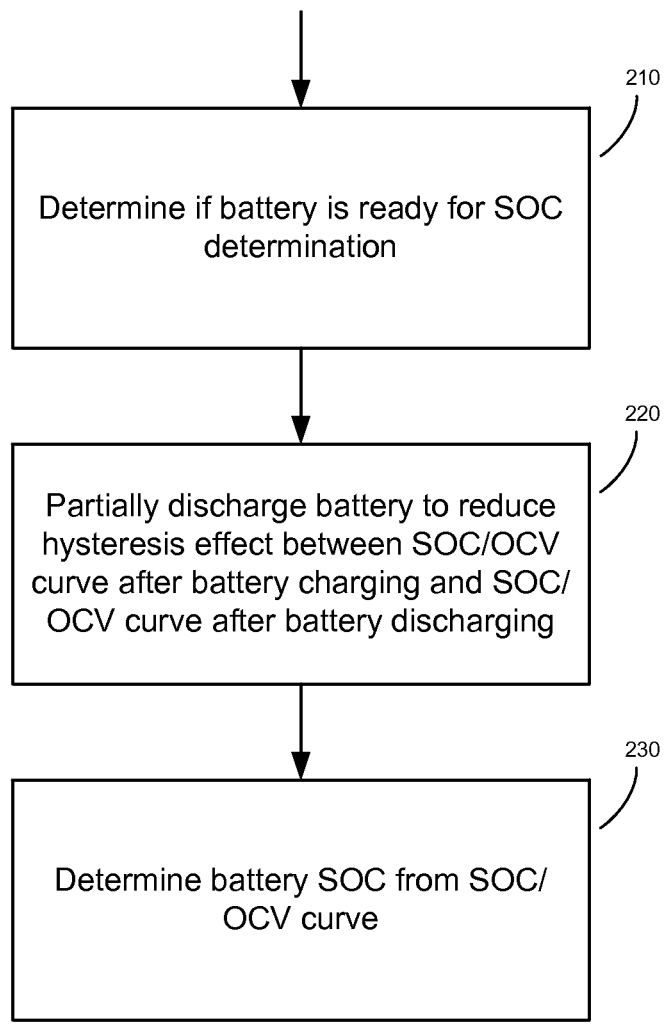
FIG. 2 illustrates an exemplary sequence of operations to determine the SOC of a battery block.

FIG. 2 illustrates one embodiment of a sequence of operations to improve the determination of the SOC of a battery. Starting at 210, it is determined whether the battery is in a suitable state to begin determination of the SOC. This includes, but is not limited to, determining if the battery is coupled to an external load and that no significant charge is being drawn from the battery and thus that the battery has reached or is tending toward a state of relaxation. At this point, depending on the recent charge/discharge history of the battery, different SOC to OCV relationships (or correlations) may hold, as discussed above. However, instead of trying to approximate the SOC to OCV relationship according to the charge/discharge history, a discharging operation is carried out to pre-condition the battery, in effect, manipulating the state of the battery to achieve a correlation between SOC and OCV that is less dependent on whether the battery has most recently been receiving charge or providing charge (i.e., charging or discharging), thereby mitigating the SOC estimation error that may otherwise result from the charge/discharge OCV hysteresis. This "pre-conditioning discharge" is shown at 220 where the battery is partially discharged. Thereafter, at 230, the battery state-of-charge, is determined by measuring the OCV and looking up (and/or calculating) the state of charge according to a pre-conditioned discharging-state correlation between SOC and OCV.

Figure 3:
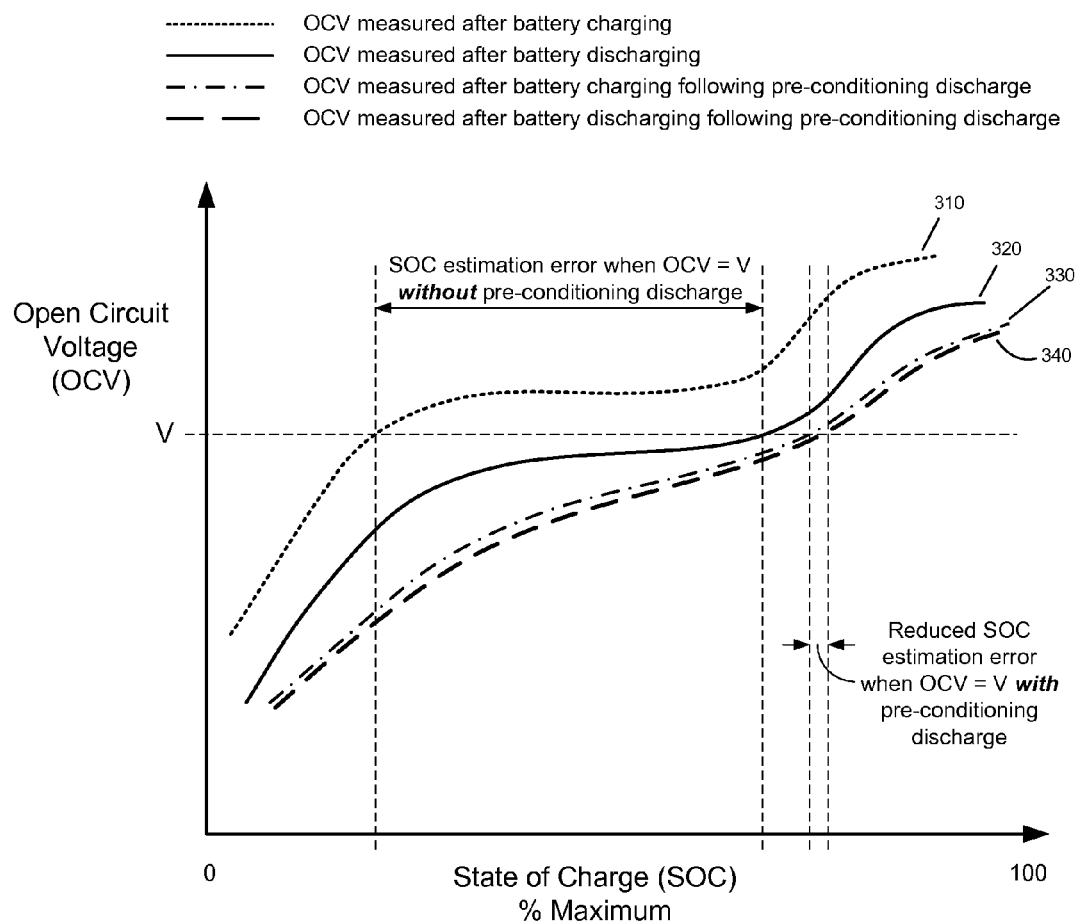
FIG. 3 shows an exemplary chart showing the reduced SOC estimation error as a result of the various embodiments described herein.

FIG. 3 shows exemplary OCV/SOC curves for a charging and discharging battery both with and without the pre-conditioning discharge operation shown at 220 of FIG. 2. The OCV/SOC curve for a battery that was charging followed by pre-conditioning discharge (curve 330) is now much closer to the OCV/SOC curve for the same battery that was discharging followed by pre-conditioning discharge (curve 340) than if no pre-conditioning discharge was performed (i.e., shown by curves 310 and 320). Thus the hysteresis-induced OCV uncertainty is mitigated by the pre-conditioning discharge so that the error resulting from OCV-based SOC determination (i.e., operation 230 of FIG. 2) is substantially reduced, particularly at the OCV voltage point (V) shown. The correlation between OCV and SOC is now easier to model accurately compared to the correlation between OCV and SOC without the pre-conditioning discharge. One other benefit of the pre-conditioning discharge is the reduction of the size of the flat central portion of the OCV/SOC curve shown in FIG. 1 (i.e., the central portion of the curve is steeper). This permits estimation of SOC from OCV with acceptable accuracy for a larger range of values of OCV.

Figure 4:
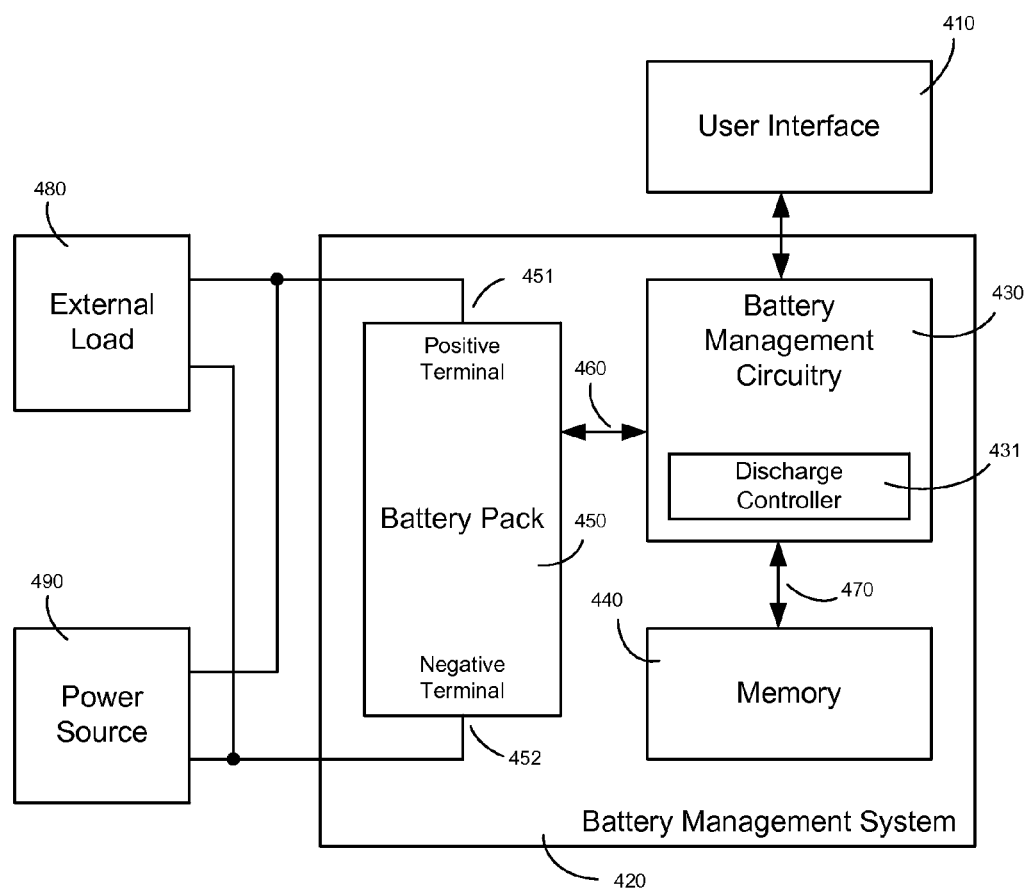
FIG. 4 illustrates one embodiment of a battery management system for determining the SOC of a battery block.

FIG. 4 depicts one embodiment of a battery management system 420 that may be used to implement the operations shown in FIG. 2. The battery management system includes battery management circuitry 430, memory 440 and the battery pack 450. The battery management circuitry 430 includes a discharge controller 431 that is capable of executing the operations described in FIG. 2 (and FIG. 7 described below) to partially discharge the battery pack. The battery management circuitry is coupled to the battery pack via interconnect 460, which is used to transmit and received multiple control and data signals to and from the battery pack. The battery management circuitry is also coupled to the memory 440 which is used to store information including, but not limited to, software code and data associated with executing the sequence of operations in FIG. 2 and FIG. 7. A user interface 410 is coupled to the battery management circuitry within the battery management system. This user interface is used to present and collect information to and from an operator of the system, the information presented including, without limitation, battery pack SOC, battery pack charging or discharging status, battery pack temperature, and EV range. The battery pack is coupled via positive and negative terminals 451 and 452 to an external load 480 (for example, the electric motor of the EV), and power source 490 (for example, a drive-time charging source such as a regenerative braking system that delivers charging power during braking in an EV or HEV, or an electrical alternator or generator in an HEV). The battery management system may include numerous other functional blocks in addition to or within the functional blocks shown, including programming and debug interfaces, maintenance and system-level data collection. The battery management system, battery management circuitry and/or discharge controller may also include various functional logic blocks, such as status logic for determining whether the battery is in a rest state, pre-conditioning logic to draw pre-conditioning current from the battery (e.g., in response to detecting that the battery is in the rest state), voltage measurement logic to measure the OCV, state-of-charge determination logic to determine the state-of-charge of the battery based on the OCV, charge-balancing logic to balance the level of charge on the various battery blocks. Any or all of those logic blocks may be implemented by one or more programmed processors (including special-purposes processor(s), microcontroller(s), general-purpose processor(s), etc.) that execute a programmed sequence of instructions to carry out the various functions performed by the logic block.

Figure 5:
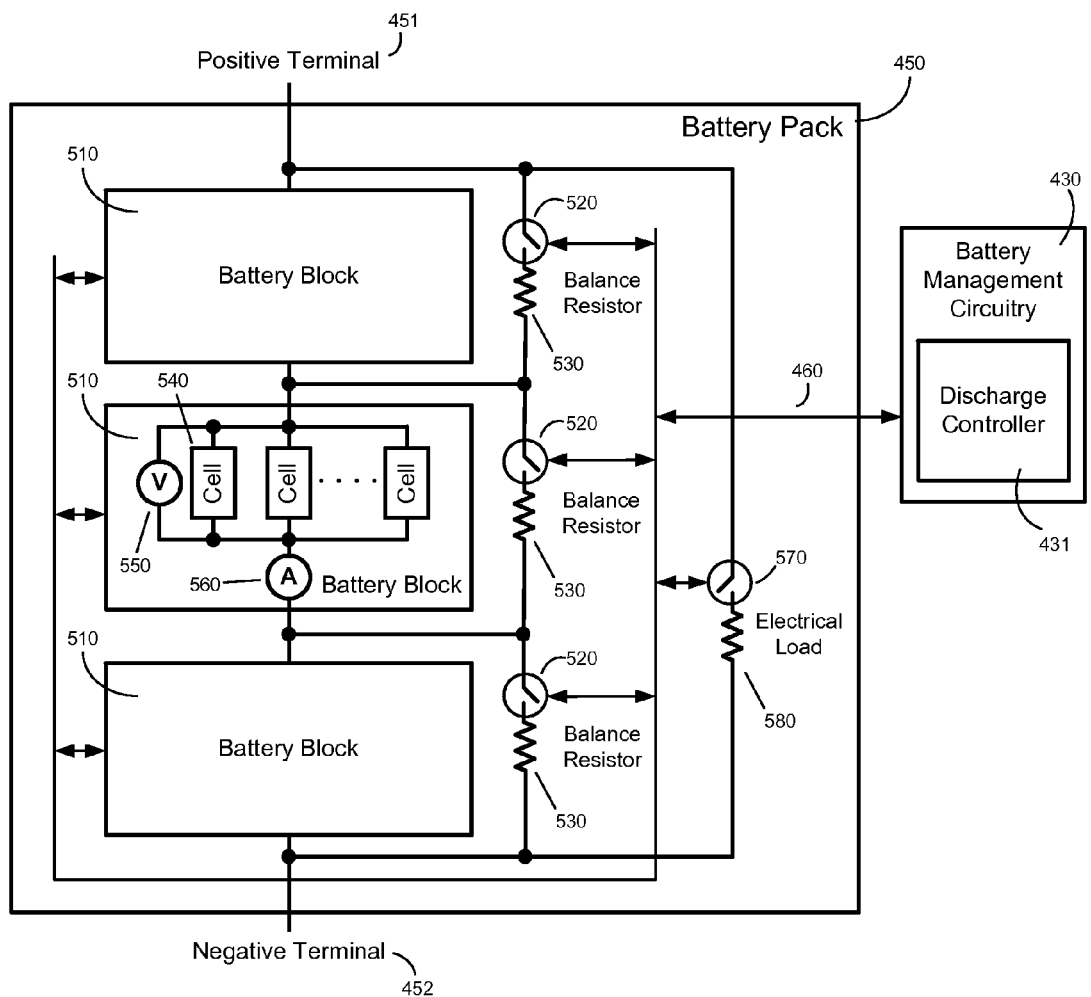
FIG. 5 illustrates one embodiment of a battery pack with circuitry for discharging.

FIG. 5 shows one embodiment of a battery pack 450 with circuitry controlled by a discharge controller (e.g., element 431 of FIG. 4) to discharge the battery blocks 510 contained within the battery pack prior to determining SOC. Each battery block 510 comprises one or more battery cells 540, along with voltage and current measurement devices, 550 and 560 respectively. It should be noted that other embodiments of a battery pack may have more or fewer voltage and current measurement devices with different electrical connections than those shown. For example, one embodiment could have only one voltage measurement device coupled between the positive (451) and negative (452) terminals. Another embodiment may have only one current measurement device coupled in series with all of the battery blocks 510 in the battery pack at either the positive or negative terminal. All voltage and current measurement devices are coupled to the battery management circuitry via the interconnect 460, though separate interconnects could alternatively be employed.

In the embodiment shown, a respective switching element 520 (e.g., a transistor, relay or any other signal-controlled switching mechanism) and balance resistor 530 are coupled in series between the terminals of each battery block. By this arrangement, each balance resistor 530 may be electrically coupled to a respective battery block 510 by closing the corresponding switching element 520 (i.e., thereby "switchably coupling" the balance resistor to the battery block) in response to commands or signals sent via the interconnect 460 from the discharge controller 431. After the switching element 520 is closed the corresponding battery pack 510 will begin to discharge at a rate determined, at least in part, by the electrical resistance of the balance resistor 530. An electrical load 580 and switching element 570 are coupled in series between the positive and negative terminals of the battery pack. After the switching element 570 is closed in response to commands sent via the interconnect 460 from the discharge controller 431, all battery blocks in the battery pack will discharge at a rate determined, at least in part, by the electrical resistance of the electrical load. The balance resistors in this embodiment may also be utilized to balance the SOC in each battery block such that all battery blocks have a similar SOC after a period of time to improve various battery characteristics, including, without limitation, maximum battery charge capacity and battery life. The electrical load, if in the form of a heating element, may also be utilized to adjust the temperature of the battery pack such that the battery pack is at a temperature where it may operate more effectively. The balance resistors and electrical load may thus have multiple functions. To further clarify, by switchably coupling the balance resistors selectively only to battery blocks with SOC levels greater than the minimum of all battery blocks, the battery block balancing function may be achieved. Battery blocks with high SOC levels will begin to discharge through the balance resistors, in contrast to battery blocks at the minimum SOC level which will not discharge as the balance resistors will not be coupled to the respective battery block. Alternatively, the balance resistors for all battery blocks may be switchably coupled to each respective battery block to cause a discharge in all battery blocks simultaneously (regardless of the existing SOC level). In this case, the discharge rate for all battery blocks may also be increased by switchably coupling the electrical load to the battery pack terminals. This load will be in parallel with the balance resistors and therefore will decrease the resistance and correspondingly increase the discharge rate. This is at least one way by which the pre-conditioning discharge function may be achieved.

Figure 6:
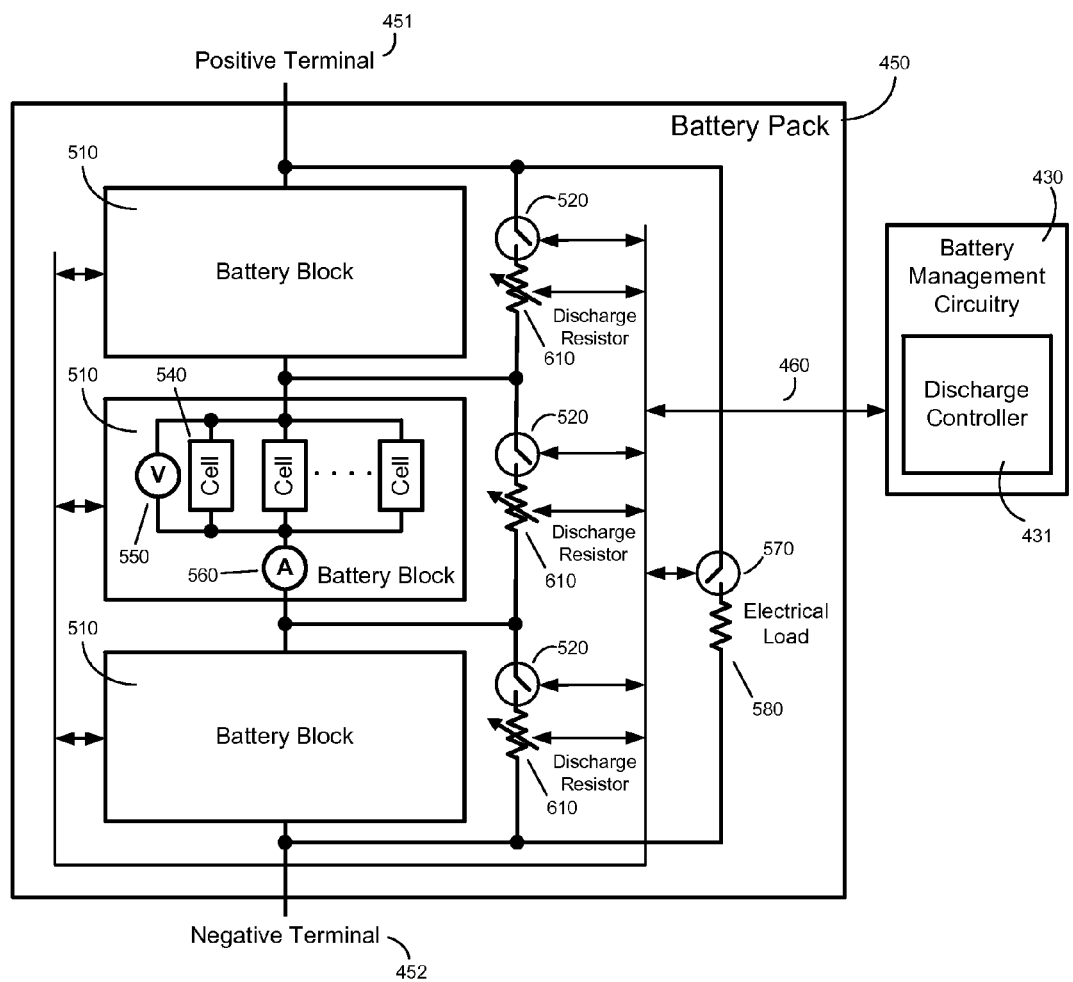
FIG. 6 illustrates an alternative embodiment of a battery pack with circuitry for discharging.

FIG. 6 shows another embodiment of a battery pack 450 with circuitry controlled by the discharge controller 431 to discharge the battery blocks 510 contained within the battery pack prior to determining SOC. In this embodiment, the fixed resistance balance resistors 530 in FIG. 5 are replaced by discharge resistors 610 that have electrical resistance that varies based, at least in part, on commands sent via the interconnect 460 from the discharge controller. In contrast to the embodiment shown in FIG. 5, the specific rate of discharge when performing a pre-conditioning discharge may be varied by the discharge controller in response to factors including, without limitation, battery age, battery temperature, battery voltage, and battery SOC level. It should be noted that other embodiments of a battery management system may have the resistor elements (the balance resistors 530, discharge resistors 610 and the electrical load 580) physically disposed at various locations and not necessarily within the battery pack. For example, and without limitation, the discharge resistors may be physically disposed outside the battery pack and/or exposed to a cooling air flow to prevent any heat generated by a discharge from heating the battery pack and effecting the operation of the battery pack.

Figure 7:
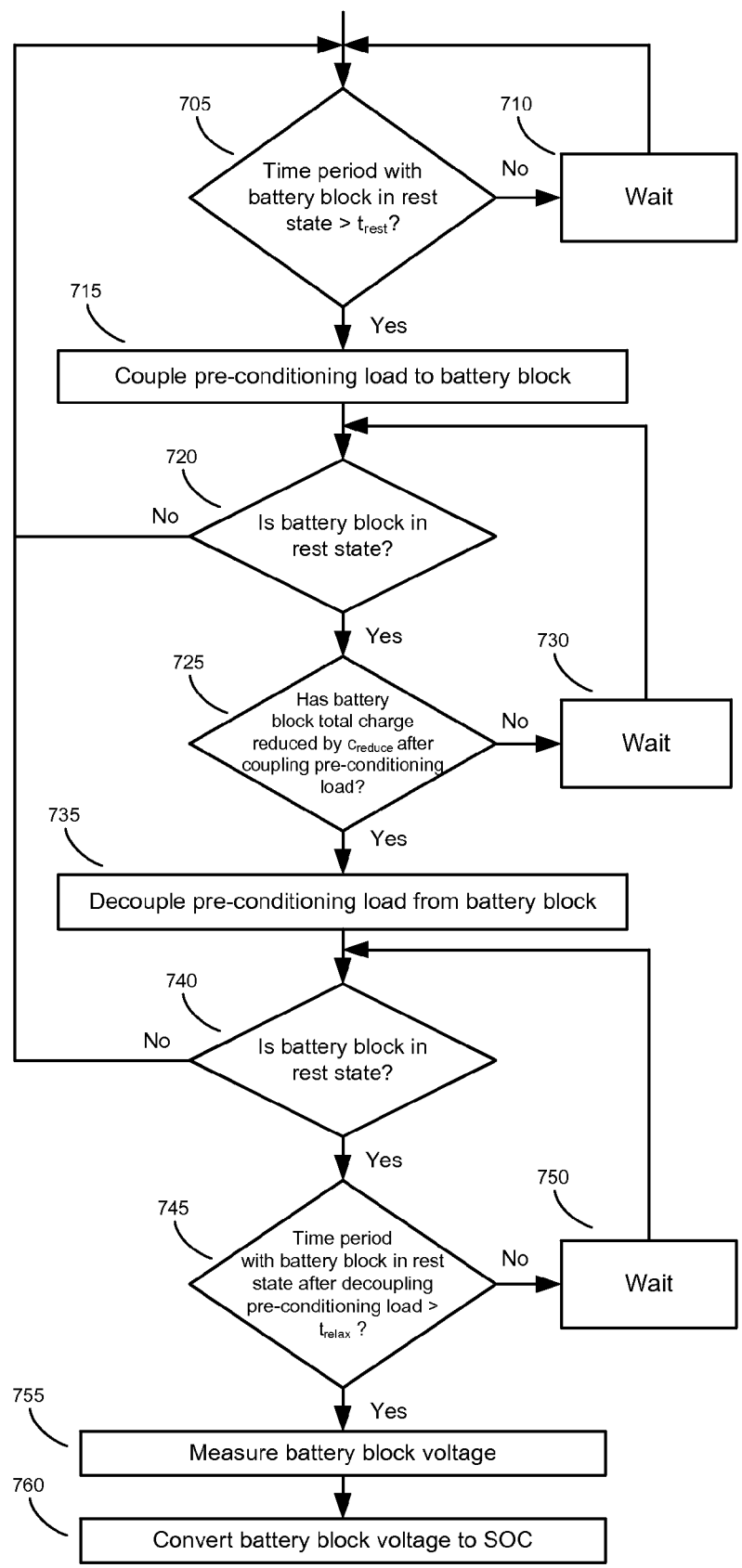
FIG. 7 shows an exemplary alternative embodiment of a sequence of operations for determining the SOC of a battery block.

FIG. 7 illustrates an exemplary sequence of operations executed in the discharge controller to pre-condition discharge a battery block 510 contained within the battery pack prior to determining SOC. The sequence begins at 705, where the time period that a battery block has been in a "rest state" (meaning, excluding charge drawn as a result of coupling the pre-conditioning load to the battery block at 715, no or negligible charge is being drawn from the battery block) is measured, the "rest state period". Other embodiments may utilize other techniques to determine if the battery block is in a rest state. For example, if a system containing a battery is "docked" in a "docking station" (e.g., putting a cell phone in a charging station or parking a EV or HEV in a specific/pre-determined parking location), a docking switch may be closed to indicate that the system in now in a rest state and thus ready to begin the pre-conditioning discharge. If the time period that a battery block has been in a rest state" is shorter than a predetermined threshold, $t_{rest}$, then a looping operation is executed until the rest state period reaches the threshold (e.g., waiting at 710 before looping back to 705). The threshold value of the rest state period, $t_{rest}$, may be a static value, calculated prior to operation of the battery pack (e.g., as part of the pack design or in accordance with the vehicle into which the pack installed), or may be dynamically calculated during the operation of the battery pack. In any case, after the rest state period reaches the $t_{rest}$ threshold (i.e. affirmative determination at 705), a pre-conditioning load is coupled to the battery block at 715 and the battery block begins discharging. The specific resistance of this pre-conditioning load may be the same or may be different for each battery block in the battery pack. The pre-conditioning load may also vary over time and with various operating conditions, including, but not limited to, temperature, the number of battery discharge cycles, battery use statistics, and battery block voltage. Certain embodiments may utilize electrical loads disposed outside of the battery pack for the pre-conditioning load, including, without limitation, electrical and/or electronic devices within an EV or HEV, such as the entertainment and navigation systems, the cabin heater, or an electrical load physically disposed adjacent to an external battery charging system, such as a nightly garage charging system. The sequence continues with 720 where the battery block discharge rate is measured to ensure the battery block is still in a rest state. This measurement may be done using a current measuring device coupled to the battery block or by some other mechanism for detecting battery discharge. If the battery block is not in a rest state (i.e., negative determination at 720), the SOC determination sequence is aborted and starts over at 705, looping until the rest state threshold has been reached. Otherwise, at 725, the reduction of the total charge in the battery block as a result of the discharge due to the pre-conditioning load coupled in 715 is measured. If the total charge reduction in the battery block is the same as or greater than a predetermined value, $c_{reduce}$, then sufficient total charge reduction has occurred to reduce the hysteresis effect (and consequently reduce the OCV to SOC determination error) and the sequence continues with operation 735 where the pre-conditioning load coupled in operation 715 is decoupled from the battery block. If the total charge reduction is the less than $c_{reduce}$ then a looping operation is executed until the total charge reduction reaches the threshold (e.g., waiting at 730 before looping back to 720). The total charge reduction threshold value of $c_{reduce}$ may be a static value, calculated prior to operation of the battery pack, or may be dynamically calculated during the operation of the battery pack. After operation 735, at 740 the battery block discharge rate is again measured to ensure that battery block is in a rest state. If the battery block is not in a rest state (i.e., negative determination at 740), the SOC determination sequence is aborted and starts over at 705, looping until the rest state threshold has been reached. The sequence continues at 745, where the time period that a battery block has been in a rest state after decoupling the pre-conditioning load at 735 is measured, the "relax" period. If the relax period is shorter than a predetermined threshold, $t_{relax}$, then a looping operation is executed until the relax period reaches the threshold (e.g., waiting at 750 before looping back to 740). The relax period threshold value of $t_{relax}$ may be a static value, calculated prior to operation of the battery pack, or may be dynamically calculated during the operation of the battery pack. Additionally, some embodiments may utilize a value of $t_{relax}$ that is zero (i.e., the result of 745 is always affirmative). In operation 755, the battery block voltage is measured using a voltage measurement device. This voltage is the OCV after pre-conditioning for the battery block. In the next operation 760 the voltage measured in 755 is converted to an SOC value using computational model that relates OCV to SOC. This model may be one or more tables of OCV values with corresponding SOC values, or may consist of mathematical formulas incorporating various parameters from the battery management system, or a combination of one or more tables and one or more formulas.

In the foregoing description and in the accompanying drawings, specific terminology and drawing symbols have been set forth to provide a thorough understanding of the present invention. In some instances, the terminology and symbols may imply specific details that are not required to practice the invention. For example, the term "coupled" is used herein to express a direct connection as well as a connection through one or more intervening circuits or structures. Device or system "programming" may include, for example and without limitation, loading a control value into a register, one-time programmable-circuit (e.g., blowing fuses within a configuration circuit during device production) or other storage circuit within an integrated circuit device of the host system (or host device) and thereby control an operational aspect of the host system or establish a host system configuration. The terms "exemplary" and "embodiment" are used to express an example, not a preference or requirement. Signal paths that appear as single conductors may include multiple conductors and vice-versa, and components shown as being included within or forming part of other components may instead be disposed separately from such other components. With regard to flow diagrams and the like, the order of operations may be different from those shown and, where practical, depicted operations may be omitted and/or further operations added.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of determination of the state-of-charge of a battery, the method comprising:
    detecting that the battery is in a rest state, wherein the battery comprises one or more battery cells, battery blocks or battery packs;
    coupling a pre-conditioning logic to the battery;
    drawing a pre-conditioning current from the battery using the pre-conditioning logic, sufficient to reduce charge of the battery by a charge reduction threshold value that is predetermined to reduce an open circuit voltage to state-of-charge determination error, in response to detecting that the battery is in the rest state to affect a correlation between the state-of-charge of the battery and an open-circuit voltage of the battery;
    measuring the open-circuit voltage of the battery after drawing the pre-conditioning current; and
    determining the state-of-charge of the battery based on the open-circuit voltage of the battery
    wherein the determining is subsequent to the completion of a partial discharge of the battery in the rest state.

2. The method of claim 1 wherein detecting that the battery is in a rest state comprises detecting that current flow through the battery is below a predetermined threshold.

3. The method of claim 2 wherein detecting that current flow through the battery is below a predetermined threshold comprises measuring current flow through the battery and comparing the measured current flow against a threshold current-flow value stored within a programmable register.

4. The method of claim 1 wherein detecting that the battery is in a rest state comprises detecting activation of a docking switch, the activation of the docking switch indicating that a system containing the battery has been docked in a predetermined location.

5. The method of claim 4 wherein the battery is associated with a passenger-conveying vehicle in which propulsion power is at least occasionally supplied by the battery.

6. The method of claim 1 wherein drawing the pre-conditioning current from the battery comprises drawing current from each battery block of the battery simultaneously.

7. The method of claim 1 wherein coupling the pre-conditioning logic comprises switchably coupling an electrical load between positive and negative output terminals of the battery to draw at least a portion of the pre-conditioning current.

8. The method of claim 1 wherein the battery includes multiple battery blocks, the method further comprising drawing current from each battery block of the battery simultaneously comprises switchably coupling a respective electrical load across each battery block of the battery.

9. The method of claim 8 further comprising determining that a first voltage across a first one of the battery blocks is higher than a second voltage across a second one of the battery blocks, and switchably coupling the respective electrical load across the first one of the battery blocks and decoupling the respective electrical load from the other one of the battery blocks to reduce the difference between the first and second voltages.

10. The method of claim 1 wherein drawing the pre-conditioning current from the battery to affect the correlation between the state-of-charge of the battery and the open-circuit voltage of the battery comprises drawing an amount of current sufficient to mitigate a difference between a charging-state correlation and a discharging-state correlation, the charging-state correlation being a correlation between the state-of-charge and the open-circuit voltage following charging of the battery, and the discharging-state correlation being a correlation between the state-of-charge and the open-circuit voltage following discharging of the battery.

11. The method of claim 1 wherein the correlation between the state-of-charge of the battery and the open-circuit voltage of the battery exhibits a dependence on whether the battery has most recently been receiving charge or providing charge, and wherein drawing the pre-conditioning current from the battery to affect the correlation between the state-of-charge of the battery and the open-circuit voltage of the battery results in a reduction of state-of-charge estimation error related to charge/discharge open circuit voltage hysteresis.

12. The method of claim 1 wherein determining the state-of-charge based on the open-circuit voltage of the battery comprises determining the state-of-charge based on the correlation between the state-of-charge of the battery and the open-circuit voltage of the battery.

13. A battery management apparatus for managing operations with respect to a battery, the battery management apparatus comprising:
    status logic to detect whether the battery is in a rest state, wherein the battery comprises one or more battery cells, battery blocks or battery packs;
    pre-conditioning logic to draw a pre-conditioning current from the battery that is sufficient to reduce charge of the battery by a charge reduction threshold value that is predetermined to reduce an open circuit voltage to state-of-charge determination error, in response to detecting that the battery is in the rest state to affect a correlation between the state-of-charge of the battery and an open-circuit voltage of the battery;
    voltage measurement logic to measure the open-circuit voltage of the battery after drawing the pre-conditioning current; and
    state-of-charge determination logic to determine the state-of-charge of the battery based on the open-circuit voltage of the battery wherein the determining is subsequent to the completion of a partial discharge of the battery in the rest state.

14. The battery management apparatus of claim 13 wherein one or more of the status logic, pre-conditioning logic, voltage measurement logic and state-of-charge determination logic is implemented at least in part by a programmed processor.

15. The battery management apparatus of claim 13 wherein the status logic comprises circuitry to detect whether current flow through the battery is below a predetermined threshold.

16. The battery management apparatus of claim 13 wherein the status logic comprises circuitry to detect activation of a docking switch, the activation of the docking switch indicating that a system containing the battery has been docked in a predetermined location.

17. The battery management apparatus of claim 13 wherein the pre-conditioning logic comprises circuitry to draw current from each battery block of the battery simultaneously.

18. The battery management apparatus of claim 13 wherein the pre-conditioning logic comprises circuitry to switchably couple an electrical load between positive and negative output terminals of the battery to draw at least a portion of the pre-conditioning current.

19. The battery management apparatus of claim 13 wherein the battery includes multiple battery blocks and wherein the pre-conditioning logic comprises circuitry to switchably couple a respective electrical load across each battery block of the battery.

20. The battery management apparatus of claim 19 further comprising charge balancing logic to determine whether a first voltage across a first one of the battery blocks is higher than a second voltage across a second one of the battery blocks, and to switchably couple the respective electrical load across the first one of the battery blocks and decouple the respective electrical load from the other one of the battery blocks to reduce the difference between the first and second voltages.

21. The battery management apparatus of claim 13 wherein the pre-conditioning logic to affect the correlation between the state-of-charge of the battery and the open-circuit voltage of the battery comprises circuitry to draw an amount of current sufficient to mitigate a difference between a charging-state correlation and a discharging-state correlation, the charging-state correlation being a correlation between the state-of-charge and the open-circuit voltage following charging of the battery, and the discharging-state correlation being a correlation between the state-of-charge and the open-circuit voltage following discharging of the battery.

22. The battery management apparatus of claim 13 wherein the correlation between the state-of-charge of the battery and the open-circuit voltage of the battery exhibits a dependence on whether the battery has most recently been receiving charge or providing charge, and wherein the pre-conditioning logic to affect the correlation between the state-of-charge of the battery and the open-circuit voltage of the battery comprises circuitry to draw sufficient current from the battery to reduce state-of-charge estimation error related to charge/discharge open circuit voltage hysteresis.

23. A battery management apparatus for managing operations with respect to a battery, the battery management apparatus comprising:
    means for detecting whether the battery is in a rest state, wherein the battery comprises one or more battery cells, battery blocks or battery packs;
    means for drawing a pre-conditioning current from the battery, that is sufficient to reduce charge of the battery by a charge reduction threshold value that is predetermined to reduce an open circuit voltage to state-of-charge determination error, in response to detecting that the battery is in the rest state to affect a correlation between the state-of-charge of the battery and an open-circuit voltage of the battery;
    means for measuring the open-circuit voltage of the battery after drawing the pre-conditioning current; and
    means for determining the state-of-charge of the battery based on the open-circuit voltage of the battery wherein the determining is subsequent to the completion of a partial discharge of the battery in the rest state.

* * * * *